(12) United States Patent
Kim et al.

(10) Patent No.: US 9,979,325 B2
(45) Date of Patent: May 22, 2018

(54) PYROELECTRIC POWER-GENERATING SYSTEM

(71) Applicants: DAIHATSU MOTOR CO., LTD., Osaka (JP); National University Corporation Nagaoka University of Technology, Niigata (JP)

(72) Inventors: Yoonho Kim, Shiga (JP); Satoru Yamanaka, Shiga (JP); Juyoung Kim, Shiga (JP); Hirohisa Tanaka, Shiga (JP); Tadachika Nakayama, Niigata (JP); Masatoshi Takeda, Niigata (JP); Noboru Yamada, Niigata (JP); Koichi Niihara, Niigata (JP)

(73) Assignees: DAIHATSU MOTOR CO., LTD., Osaka (JP); National University Corporation Nagaoka University of Technology, Niigata (JP)

( * ) Notice: Subject to any disclaimer, the term of this patent is extended or adjusted under 35 U.S.C. 154(b) by 234 days.

(21) Appl. No.: 14/430,810

(22) PCT Filed: Jun. 28, 2013

(86) PCT No.: PCT/JP2013/067905
§ 371 (c)(1),
(2) Date: Mar. 24, 2015

(87) PCT Pub. No.: WO2014/069045
PCT Pub. Date: May 8, 2014

(65) Prior Publication Data
US 2015/0256108 A1    Sep. 10, 2015

(30) Foreign Application Priority Data

Oct. 31, 2012  (JP) ................................. 2012-241227
Oct. 31, 2012  (JP) ................................. 2012-241228

(51) Int. Cl.
*H01L 37/02* (2006.01)
*H02N 11/00* (2006.01)
*H01L 35/30* (2006.01)

(52) U.S. Cl.
CPC ........... *H02N 11/002* (2013.01); *H01L 35/30* (2013.01); *H01L 37/02* (2013.01)

(58) Field of Classification Search
CPC ........ H01L 37/02; H01L 35/30; H02N 11/002
(Continued)

(56) References Cited

U.S. PATENT DOCUMENTS 4,425,540 A    1/1984   Olsen
9,190,597 B2   11/2015  Kim et al.
(Continued)

FOREIGN PATENT DOCUMENTS

EP    2752985 A1    7/2014
JP    H1-133581 A   5/1989
(Continued)

OTHER PUBLICATIONS

Extended European Search Report issued by the European Patent Office (EPO) dated Jun. 20, 2016 in connection with European Patent Application No. 13850370.1.
(Continued)

*Primary Examiner* — John K Kim
(74) *Attorney, Agent, or Firm* — Edwards Neils LLC; Jean C. Edwards, Esq.

(57) ABSTRACT

A power-generating system includes a heat source which is able to produce temporal temperature variation; a first device which is able to produce temporal temperature variation based on the temperature change of the heat source and in which polarization occurs; a second device for taking out a net generating power from the first device; a temperature sensor that detects the temperature of the first device; a
(Continued)

voltage application device that applies a voltage to the first device; and a control unit for activating the voltage application device on detecting an increase in temperature of the first device and for stopping the voltage application device on detecting a decrease in temperature of the first device by the temperature sensor.

3 Claims, 8 Drawing Sheets

(58) Field of Classification Search
USPC .......................................................... 310/306
IPC ................................. H01L 37/02; H02N 11/00
See application file for complete search history.

(56) References Cited

U.S. PATENT DOCUMENTS

| | | | | |
|---|---|---|---|---|
| 2010/0233072 | A1* | 9/2010 | Miles | C01G 33/00 |
| | | | | 423/594.8 |
| 2010/0289377 | A1* | 11/2010 | Erbil | H01L 37/02 |
| | | | | 310/306 |
| 2011/0299566 | A1* | 12/2011 | Ueda | G01K 7/36 |
| | | | | 374/177 |
| 2013/0002091 | A1 | 1/2013 | Kim et al. | |
| 2015/0001989 | A1 | 1/2015 | Kim et al. | |
| 2015/0256108 | A1* | 9/2015 | Kim | H01L 37/02 |
| | | | | 310/306 |

FOREIGN PATENT DOCUMENTS

| | | |
|---|---|---|
| JP | H05-299717 A | 11/1993 |
| JP | 2009-117430 A | 5/2009 |
| JP | 2011-250675 A | 12/2011 |
| JP | 2013-093948 A | 5/2013 |
| JP | 5759865 B2 | 8/2015 |
| JP | 5865646 B2 | 2/2016 |
| WO | 2008/020480 A1 | 2/2008 |
| WO | 2012/011298 A1 | 1/2012 |
| WO | 2013/031774 A1 | 3/2013 |

OTHER PUBLICATIONS

International Preliminary Report on Patentability issued by WIPO dated May 14, 2015 in connection with Intl. Patent Application No. PCT/JP2013/067905.
Randall B. Olsen et al.; Pyroelectric energy conversion: Hysteresis loss and temperature sensitivity of a ferroelectric material; Journal of Applied Physics.; Oct. 1983; pp. 5941-5944; vol. 54, No. 10; AIP Publishing LLC; US.
International Search Report Issued in PCT/JP2013/067905 dated Aug. 6, 2013.
Written Opinion Issued in PCT/JP2013/067905 dated Aug. 6, 2013.

* cited by examiner

PYROELECTRIC POWER-GENERATING SYSTEM

CROSS-REFERENCE TO RELATED APPLICATIONS

The present invention is a 35 U.S.C. 371 National Stage Entry of PCT/JP2013/067905, filed Jun. 28, 2013, which claims priority from Japanese Patent Application Nos. 2012-241227, filed on Oct. 31, 2012 and 2012-241228, filed on Oct. 31, 2012, the contents of all of which are herein incorporated by reference in their entirety.

TECHNICAL FIELD

The present invention relates to a power-generating system, to be specific, to a power-generating system to be mounted on a vehicle such as an automobile.

BACKGROUND ART

Conventionally, a large amount of heat energy is released and lost as, for example, waste heat, light, etc. in various energy-using devices such as internal combustion engines including an automobile engine; heat exchangers including a boiler and air-conditioning equipment; motor generators including a power generator and a motor; and luminous devices including lightings.

Nowadays, recovery and recycling of released heat energy as an energy source has been required in view of energy conservation. To be specific, as such a system, for example, a power-generating system including a heat source which is able to produce temporal temperature variation, a first device (dielectric, etc.) in which polarization occurs by the piezoelectric effect, the pyroelectric effect, the Seebeck effect, etc. based on the temperature change of the heat source, and a second device (electrode, etc.) which is disposed to face the first device with the first device sandwiched therebetween in order to take out a net generating power from the first device has been proposed (ref: for example, the following Patent Document 1).

CITATION LIST

Patent Document

Patent Document 1
Japanese Unexamined Patent Publication No. 2011-250675

SUMMARY OF THE INVENTION

Problem to be Solved by the Invention

Meanwhile, the power-generating system described in the above-described Patent Document 1 requires power generation with more efficiency.

When the above-described power-generating system is set in a limited space, for example, at the inside of an automobile, space saving is required.

An object of the present invention is to provide a power-generating system capable of excellently efficient generation of electricity by an easy method.

Also, an object of the present invention is to provide a power-generating system capable of excellently efficient generation of electricity by an easy method and capable of achieving space saving.

Means for Solving the Problem

To achieve the above object, a power-generating system of the present invention includes
a heat source which is able to produce temporal temperature variation;
a first device which is able to produce temporal temperature variation based on the temperature change of the heat source and in which polarization occurs;
a second device for taking out a net generating power from the first device;
a detection unit that detects the temperature of the first device;
a voltage application unit that applies a voltage to the first device; and
a control unit for activating the voltage application unit on detecting an increase in temperature of the first device and for stopping the voltage application unit on detecting a decrease in temperature of the first device by the detection unit.

Also, to achieve the above object, a power-generating system of the present invention includes
a heat source which is able to produce temporal temperature variation;
a first device which is able to produce the temporal temperature variation based on the temperature change of the heat source and in which polarization occurs;
a second device for taking out a net generating power from the first device; and
a voltage application unit that applies a voltage to the first device using the net generating power taken out from the first device.

With the power-generating system of the present invention, a net generating power can be efficiently taken out from the first device by applying a voltage to the first device. In the power-generating system, the net generating power taken out from the first device can be used in the voltage application unit, so that an external power source, etc. for activating the voltage application unit is not required and space saving can be achieved.

In the power-generating system of the present invention, it is preferable that a battery which is electrically connected to the second device and is capable of storing a net generating power taken out from the first device is included; the voltage application unit is electrically connected to the battery; and a voltage is applied to the first device using electrical power stored in the battery.

In the power-generating system; the net generating power taken out from the first device is stored in the battery, so that electrical power stored in the battery can be used in an arbitrary electric device.

In the power-generating system, electrical power stored in the battery is used in the voltage application unit, so that a voltage can be applied to the first device at an arbitrary timing and thus, power generation efficiency can be improved.

In the power-generating system of the present invention, it is preferable that the power-generating system includes a detection unit that detects the temperature of the first device and a control unit for activating the voltage application unit on detecting an increase in temperature of the first device and for stopping the voltage application unit on detecting a decrease in temperature of the first device by the detection unit.

In the power-generating system, when an increase in temperature of the first device is detected, the voltage application unit is activated and a voltage is applied to the first device. On the other hand, when a decrease in temperature of the first device is detected, the voltage application unit is stopped and the application of a voltage is stopped.

Thus, with the power-generating system, energy can be efficiently taken out from the first device by a relatively easy method of activating or stopping the voltage application unit, so that power generation efficiency can be improved.

Effects of the Invention

In the power-generating system of the present invention, when an increase in temperature of the first device is detected, the voltage application unit is activated and a voltage is applied to the first device. On the other hand, when a decrease in temperature of the first device is detected, the voltage application unit is stopped and the application of a voltage is stopped.

With the power-generating system, energy can be efficiently taken out from the first device by a relatively easy method of activating or stopping the voltage application unit, so that power generation efficiency can be improved.

With the power-generating system of the present invention, energy can be efficiently taken out by applying a voltage to the first device, so that power generation efficiency can be improved and furthermore, an external power source for applying a voltage is not required and thus, space saving can be achieved.

EMBODIMENT OF THE INVENTION

1. First Embodiment

Figure 1:
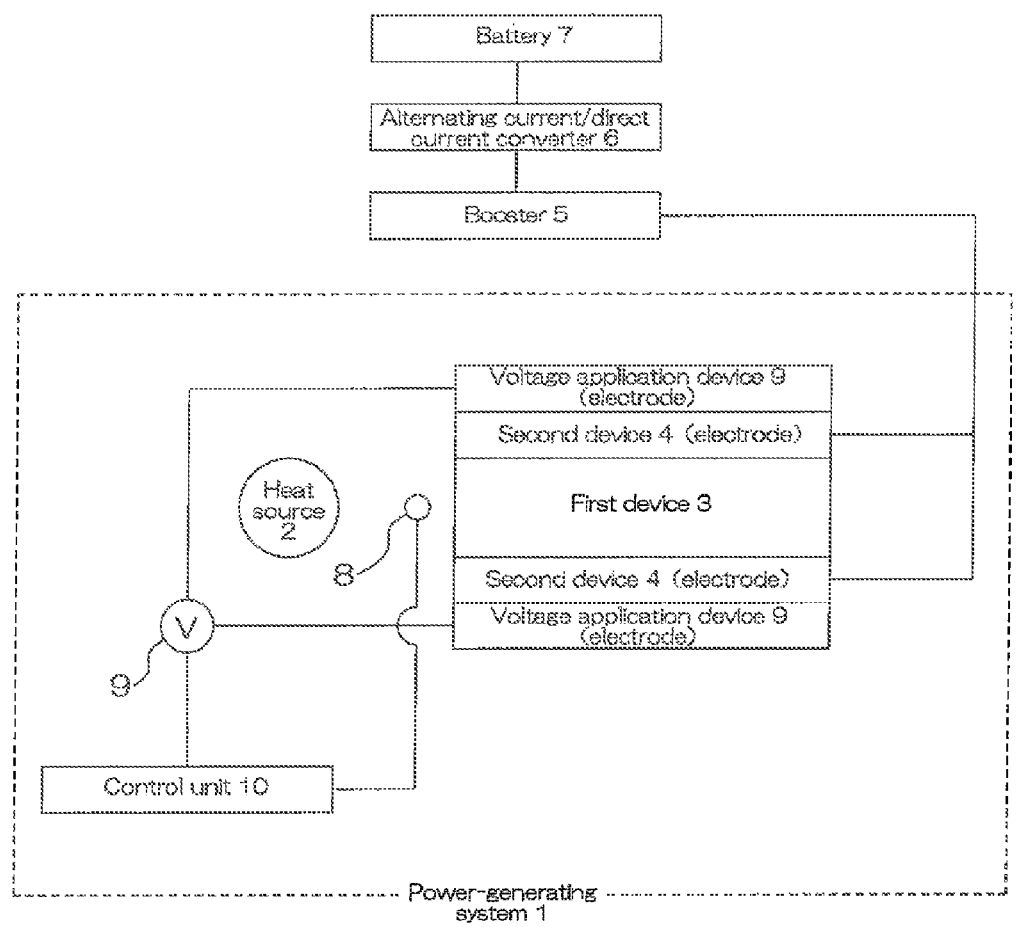
FIG. 1 is a schematic diagram illustrating the configuration of a first embodiment of the power-generating system of the present invention.

FIG. 1 is a schematic diagram illustrating the configuration of a first embodiment of the power-generating system of the present invention.

In FIG. 1, a power-generating system 1 includes a heat source 2 which is able to produce temporal temperature variation; a first device 3 which is able to produce temporal temperature variation based on the temperature change of the heat source 2 and in which polarization occurs; a second device 4 that takes out a net generating power from the first device 3; a temperature sensor 8 as a detection unit that detects the temperature of the first device 3; a voltage application device 9 as a voltage application unit that applies a voltage to the first device 3; and a control unit 10 as a control unit for activating the voltage application device 9 on detecting an increase in temperature of the first device 3 and for stopping the voltage application device 9 on detecting a decrease in temperature of the first device 3 by the temperature sensor 8.

The heat source 2 is not particularly limited, as long as the heat source has a temporal temperature variation, and examples thereof include various energy-using devices such as internal combustion engines and luminous devices.

The internal combustion engine is, for example, a device that outputs motive power for vehicles. For example, a single cylinder or a multicylinder type is used and in the single cylinder or multicylinder, a multi-stroke cycle (e.g., two-stroke cycle, four-stroke cycle, and six-stroke cycle, etc.) is used.

In such an internal combustion engine, pistons repeatedly move up and down in the cylinders and such up-down moves of the pistons allow, for example, in the four-stroke cycle system, performance of an intake stroke, a compression stroke, a power stroke, and an exhaust stroke sequentially and combustion of fuel to output motive power.

In such an internal combustion engine, in the exhaust stroke, a high temperature exhaust gas is discharged via the exhaust gas pipe. The heat energy is conducted with the exhaust gas as a heating medium and the internal temperature of the exhaust gas pipe increases.

Meanwhile, in other strokes (strokes excluding the exhaust stroke), the exhaust gas amount in the exhaust gas pipe decreases and therefore, the internal temperature of the exhaust gas pipe decreases compared with the exhaust stroke.

Thus, the temperature of the internal combustion engine increases in the exhaust stroke, decreases in the intake stroke, compression stroke, and power stroke: that is, the temporal temperature variation is produced.

In particular, the above-described strokes are repeated periodically and sequentially in accordance with the piston cycle and therefore, the internal temperature of the exhaust gas pipes of the cylinders of the internal combustion engine changes periodically in accordance with the cycle of the repetition of the above-described strokes, to be more specific, a high-temperature state and a low-temperature state are repeated periodically.

The temperature of the luminous device increases when the luminous device is turned on (emission), for example, by heat energy of light such as infrared radiation and visible light as a heating medium, while when the luminous device is turned off, its temperature decreases. Thus, the temperature of the luminous devices changes over time when turned on (emission) or off over time.

In particular, for example, when the luminous device is a luminous device that repeats turning on and off of light over time intermittently (blinking (switching) luminous device), the temperature of the luminous device changes periodically by heat energy of light at the time when turned on (emission), to be more specific, a high-temperature state and a low-temperature state are repeated periodically.

Examples of the heat source 2 further include a plurality of heat sources and a temperature change can also be caused by switching between the plurality of heat sources.

To be more specific, for example, in an embodiment, the heat source includes two heat sources, i.e., a low temperature heat source (coolant, etc.) and a high temperature heat source (e.g., heating material, etc.) having a temperature higher than the low temperature heat source; and the low temperature heat source and the high temperature heat source are switched back and forth alternately over time.

In this manner, the temperature of the heat source can be increased or decreased over time and, in particular, by repeating the switching back and forth between the low temperature heat source and the high temperature heat source periodically, the periodic temperature change can be achieved.

The heat source 2 including a plurality of switchable heat sources is not particularly limited and examples thereof include a high temperature air furnace (e.g., a high-temperature gas generator described in WO96-05474) including a combustion low temperature air supplier, a regenerator heat exchanger, a high temperature gas exhauster, and a supply/exhaust switch valve and a seawater exchange system (hydrogen storage alloy actuator seawater exchange system) using a high temperature heat source, a low temperature heat source, and a hydrogen storage alloy.

As the heat source 2, the above-described heat sources may be used singly or in combination of two or more.

As the heat source 2, preferably, a heat source that undergoes a periodic temperature change over time is used.

As the heat source 2, preferably, an internal combustion engine is used.

The first device 3 is a device that undergoes polarization in accordance with the temperature change of the heat source 2.

The polarization here is defined as the following: a phenomenon of electromotive force occurrence in a material, including, for example, a phenomenon of occurrence of a potential difference by dielectric polarization due to displacement of plus and minus ions based on the deformation of a crystal, such as the piezoelectric effect; and/or a phenomenon of occurrence of a potential difference by changes in the dielectric constant due to a temperature change, such as the pyroelectric effect.

Examples of the first device 3 include, to be more specific, a device that undergoes polarization by the piezoelectric effect and a device that undergoes polarization by the pyroelectric effect.

In the piezoelectric effect (phenomenon), when a pressure or a deformation is applied, polarization is caused in accordance with the degree of the pressure or the deformation.

The first device 3 that undergoes polarization by the piezoelectric effect is not particularly limited and a known piezoelectric element may be used.

When a piezoelectric element is used as the first device 3, the piezoelectric element is disposed, for example, so that the piezoelectric element is brought into contact with the heat source 2 or into contact with (exposed to) the heating medium (the above-described exhaust gas, light, etc.) that conducts the heat of heat source 2 while the surrounding thereof is fixed by a fixing member to suppress the volume expansion thereof.

The fixing member is not particularly limited and, for example, the second device 4 (e.g., electrode, etc.) to be described later may also be used.

In this case, the piezoelectric element is heated or cooled by the temperature change (or sometimes through a heating medium (the above-described exhaust gas, light, etc.)) over time of the heat source 2, which allows expansion or shrinkage thereof.

In such a case, the volume expansion of the piezoelectric element is suppressed by the fixing member and therefore, the piezoelectric element is pressed by the fixing member, which allows polarization to occur by the piezoelectric effect or phase transformation near the Curie temperature. In this manner, although to be described later, a net generating power is taken out from the piezoelectric element via the second device 4.

In such a piezoelectric element, usually, a heated state or a cooled state is kept and when its temperature becomes constant (that is, the volume is constant), the polarization is neutralized and by cooling or heating thereafter, the piezoelectric element undergoes polarization again.

Thus, as described above, when the temperature of the heat source 2 changes periodically and a high-temperature state and a low-temperature state are periodically repeated, the piezoelectric element is heated and cooled repeatedly and periodically and therefore, polarization and neutralization of the piezoelectric element are periodically repeated.

As a result, a net generating power can be taken out as a periodically changing waveform (e.g., alternating current, pulsating current, etc.) by the second device 4 to be described later.

The pyroelectric effect is, for example, the effects (phenomenon) such as the following: when an insulator (dielectric) is heated or cooled, the insulator undergoes polarization in accordance with the temperature change. The pyroelectric effect includes a first effect and a second effect.

In the first effect, at the time of heating or cooling of the insulator, spontaneous polarization occurs by the temperature change and an electric charge is generated on the insulator surface.

In the second effect, at the time of heating or cooling of the insulator, pressure deflection is caused in the crystal structure by the temperature change and the pressure or the deformation on the crystal structure causes piezoelectric polarization (piezoelectric effect).

Such a device that undergoes polarization by the pyroelectric effect is not particularly limited and a known pyroelectric element may be used.

When a pyroelectric element is used as the first device 3, the pyroelectric element is disposed, for example, so as to be in contact with the heat source 2 or so as to be in contact with (exposed to) the heating medium (the above-described exhaust gas, light, etc.) that conducts the heat of the heat source 2.

In such a case, the pyroelectric element is heated or cooled by temperature changes (or sometimes through a heating medium (the above-described exhaust gas, light, etc.)) over time of the heat source 2 and undergoes polarization by its pyroelectric effect (including the first effect and second effect). In this manner, although to be described later, a net generating power is taken out from the pyroelectric element via the second device 4.

In such a pyroelectric element, usually, a heated state or a cooled state is kept and when its temperature becomes constant, the polarization is neutralized and by cooling or heating thereafter, the pyroelectric element undergoes polarization again.

Thus, as described above, when the temperature of the heat source 2 changes periodically and a high-temperature state and a low-temperature state are periodically repeated, the pyroelectric element is heated and cooled periodically and repeatedly and therefore, the polarization and neutralization of the pyroelectric element are periodically repeated.

As a result, a net generating power can be taken out as a periodically changing waveform (e.g., alternating current, pulsating current, etc.) by the second device 4 to be described later.

These first devices 3 may be used singly or in combination of two or more.

Examples of the first device 3 that may be used are, as described above, to be specific, a known pyroelectric element (e.g., $BaTiO_3$, $CaTiO_3$, $(CaBi)TiO_3$, $BaNd_2Ti_5O_{14}$, $BaSm_2Ti_4O_{12}$, lead zirconate titanate ($PZT:Pb(Zr,Ti)O_3$), etc.); a known piezoelectric element (e.g., crystal ($SiO_2$), zinc oxide (ZnO), Rochelle salt (potassium sodium tartrate) ($KNaC_4H_4O_5$), lead zirconate titanate ($PZT:Pb\ (Zr,Ti)O_3$), lithium niobate ($LiNbO_3$), lithium tantalate ($LiTaO_3$), lithium tetraborate ($L_2B_4O_7$), langasite ($La_3Ga_5SiO_{14}$), aluminum nitride (AlN), tourmaline, polyvinylidene fluoride (PVDF), etc.); $Ca_3(VO_4)_2$; $Ca_3(VO_4)_2/Ni$, $LiNbO_3$; $LiNbO_3/Ni$, $LiTaO_3$; $LiTaO_3/Ni$; $Li(Nb_{0.4}Ta_{0.6})O_3$; $Li(Nb_{0.4}Ta_{0.6})O_3/Ni$; $Ca_3\{(Nb,Ta)O_4\}_2$; and $Ca_3\{(Nb,Ta)O_4\}_2/Ni$.

The Curie temperature of the first device 3 is, for example, −77° C. or higher, preferably −10° C. or higher, and, for example, 1300° C. or lower, preferably 900° C. or lower.

The relative dielectric constant of the first device 3 (insulator (dielectric)) is, for example, 1 or higher, preferably 100 or higher, and even more preferably 2000 or higher.

In such a power-generating system 1, higher the relative dielectric constant of the first device 3 (insulator (dielectric)) is, the higher the energy conversion efficiency is, which allows for obtainment of a net generating power at high voltage. However, when the relative dielectric constant of the first device 3 is below the above-described lower limit, the energy conversion efficiency is low and the voltage of the obtained net generating power may be low.

In the first device 3 (insulator (dielectric)), polarization occurs by the temperature change of the heat source 2 and the polarization may be any of electronic polarization, ionic polarization, and orientation polarization.

For example, it has been expected that with those materials in which polarization occurs by orientation polarization (e.g., liquid crystal material, etc.), improvement in power generation efficiency can be achieved by changing its molecule structure.

In FIG. 1, the second device 4 is provided so as to take out a net generating power from the first device 3.

Such a second device 4 is not particularly limited and includes, for example, two electrodes (e.g., copper electrode, silver electrode, etc.) that are disposed to face each other with the above-described first device 3 sandwiched therebetween and lead wires to be connected to these electrodes and is electrically connected to the first device 3.

The temperature sensor 8 is provided in the proximity of or in contact with the first device 3 to detect the temperature of the first device 3. The temperature sensor 8 directly detects the surface temperature of the first device 3 or detects the ambient temperature of the surrounding of the first device 3, as the temperature of the first device 3, and, for example, a known temperature sensor such as an infrared thermometer and a thermocouple thermometer is used.

The voltage application device 9 is provided directly or in the proximity of the first device 3 to apply a voltage to the first device 3. To be specific, the voltage application device 9 includes, for example, separately from the above-described second device 4, two electrodes (for example, copper electrode, silver electrode, etc.) that are disposed to face each other with the first device 3 interposed therebetween, a voltage application power source V, and lead wires connected to these and is disposed so that the first device 3 and the second device 4 are interposed between their electrodes.

The control unit 10 is a unit (for example, ECU: Electronic Control Unit) that carries out electrical control in the power-generating system 1 and is configured from a micro computer including a CPU, a ROM, and a RAM.

The control unit 10 is electrically connected to the temperature sensor 8 and the voltage application device 9 and, although to be described later, activates or stops the voltage application device 9 when an increase or decrease in temperature of the first device 3 is detected by the above-described temperature sensor 8.

In a power-generating system 1 shown in FIG. 1, the second device 4 is electrically connected to, in sequence, a booster 5, an alternating current/direct current converter (AC-DC converter) 6, and a battery 7.

To generate electricity by such a power-generating system 1, for example, first, the temperature of the heat source 2 is increased or decreased over time or preferably, the temperature is changed periodically to heat and/or cool the first device 3 by the heat source 2.

In accordance with such a temperature change, polarization is caused preferably periodically in the above-described first device 3. Thereafter, through the second device 4, a net generating power is taken out as a periodically changing waveform (e.g., alternating current, pulsating current, etc.) in accordance with the periodical polarization of the first device 3.

In such a power-generating system 1, the temperature of the heat source 2 is, in a high-temperature state, for example, 200 to 1200° C., preferably 700 to 900° C.; in a low-temperature state, below the above-described high-temperature state temperature, to be more specific, for example, 100 to 800° C., preferably 200 to 500° C.; and the temperature difference between the high-temperature state and the low-temperature state is, for example, 10 to 600° C., preferably 20 to 500'C.

The repetition cycle of the high-temperature state and low-temperature state is, for example, 10 to 400 cycles/sec, preferably 30 to 100 cycles/sec.

In such a power-generating system 1, for more efficient generation of electricity, a voltage is applied to the first device 3 in accordance with the temperature state of the first device 3.

That is, in the power-generating system 1, along with the above-described heating and/or cooling by the heat source 2, the temperature of the first device 3 is continuously measured by the temperature sensor 8 to detect if the first device 3 is in an increased-temperature state or a decreased-temperature state. To be more specific, for example, when the temperature of the first device 3 detected by the temperature sensor 8 increases higher than a predetermined value that is set in advance (e.g., 0.2° C./s etc.), the first device 3 is detected as an increased-temperature state. When the temperature of the first device 3 decreases lower than a predetermined value that is set in advance (e.g., 0.2° C./s etc.), the first device 3 is detected as a decreased-temperature state.

In the power-generating system 1, when the first device 3 is detected as an increased-temperature state, the voltage application device 9 is activated by the control unit 10 and a predetermined voltage is applied to the first device 3.

As the applied voltage, the intensity of the electric field is, for example, 0.2 kV/mm or higher, preferably 0.4 kV/mm or higher, and, for example, 5 kV/mm or lower, preferably 4 kV/mm or lower.

When the applied voltage (electric field) is within the above-described range, the energy amount taken out from the first device 3 and the energy amount consumed by the voltage application device 9 can be balanced and thus, excellently efficient generation of electricity is achieved.

The time for applying a voltage is until the first device 3 reaches a decreased-temperature state, to be specific, during an increased-temperature state.

When the first device 3 is detected as a decreased-temperature state, the voltage application device 9 is stopped by the control unit 10 and the application of a voltage to the first device 3 is stopped.

The time for stopping the application of a voltage is until the first device 3 reaches an increased-temperature state, to be specific, during a decreased-temperature state.

The required time from activation of the voltage application device 9 until application of the above-described voltage (that is, arrival of the intensity of the electric field at the above-described predetermined value) and the required time from stop of the voltage application device 9 until arrival of the intensity of the electric field at 0 kV/mm can be regarded as substantially 0 second.

That is, in the power-generating system 1, the time for a voltage below the above-described predetermined value to be applied is substantially 0 second and a state in which a voltage at the above-described predetermined value is applied (ON) and a state in which a voltage is not applied (OFF) are switched by the control unit 10.

In this manner, in the above-described power-generating system 1, when an increase in temperature of the first device 3 is detected, the voltage application device 9 is activated and a voltage is applied to the first device 3. On the other hand, when a decrease in temperature of the first device 3 is detected, the voltage application device 9 is stopped and the application of a voltage is stopped.

With such a power-generating system 1, by a relatively easy method of activating or stopping the voltage application device 9, that is, operating ON/OFF, energy can be efficiently taken out from the first device 3 compared with the case where a voltage is not applied and thus, power generation efficiency can be improved.

In such a power-generating system 1, the first device 3 may be temporarily maintained in a constant temperature state (temperature change amount is below a predetermined value (e.g., 0.2° C./s)) without an increase or decrease in temperature in accordance with a heating and/or cooling method. In such a case, a voltage is applied during an increase in temperature of the first device 3 and during a constant temperature state after the increase thereof and the application of a voltage is stopped during a decrease in temperature and during a constant temperature state after the decrease thereof. As described later, in the case of using an internal combustion engine 11 of an automobile as the heat source 2, the first device 3 is not substantially brought into a constant temperature state and an increased-temperature state and a decreased-temperature state are repeated.

Also, as a method for improvement of power generation efficiency, as described above, for example, it has been considered that not only the voltage application device 9 is simply activated or stopped, but also the degree of the applied voltage changes in accordance with the temperature state of the first device 3. However, in such a method, there is a disadvantage that a complicated operation of gradually increasing or decreasing the applied voltage is required, which takes labor.

Meanwhile, in the above-described power-generating system 1, by a relatively easy method of activating or stopping the voltage application device 9, power generation efficiency can be improved.

Furthermore, when the above-described first device 3 is exposed to an environment in which the temperature is higher than the Curie temperature, the first device 3 may be damaged, which may reduce power generation performance or power generation may not be achieved. However, in the above-described power-generating system 1, when the temperature of the first device 3 is increased, a voltage is applied, so that even if the first device 3 is exposed to an environment in which the temperature is higher than the Curie temperature, damages to the first device 3 can be suppressed and reduction in power generation performance and power generation failure of the power-generating system 1 can be suppressed. As a result, electricity can be generated with excellent efficiency even under a high-temperature environment.

The net generating power thus taken out from the power-generating system 1 is boosted in the booster 5 connected to the second device 4, as in a state of a periodically changing waveform (e.g., alternating current, pulsating current, etc.). For the booster 5, a booster that is capable of boosting the alternating current voltage with excellent efficiency with a simple structure using, for example, a coil, condenser, etc is used.

Then, the net generating power with its voltage boosted by the booster 5 is converted to a direct current voltage in the alternating current/direct current converter 6 and thereafter, stored in the battery 7.

With such a power-generating system 1, the heat source 2 having a temporal temperature variation is used and therefore, a changing voltage (e.g., alternating current voltage) can be taken out and, as a result, compared with the case where a constant voltage (direct current voltage) is taken out, a net generating power can be stored with a simple structure and excellent boosting efficiency.

Furthermore, when the heat source 2 is a heat source that undergoes a periodic temperature change, the net generating power can be taken out as a periodically changing waveform and, as a result, the net generating power can be stored with a simple structure and excellent boosting efficiency.

Figure 2:
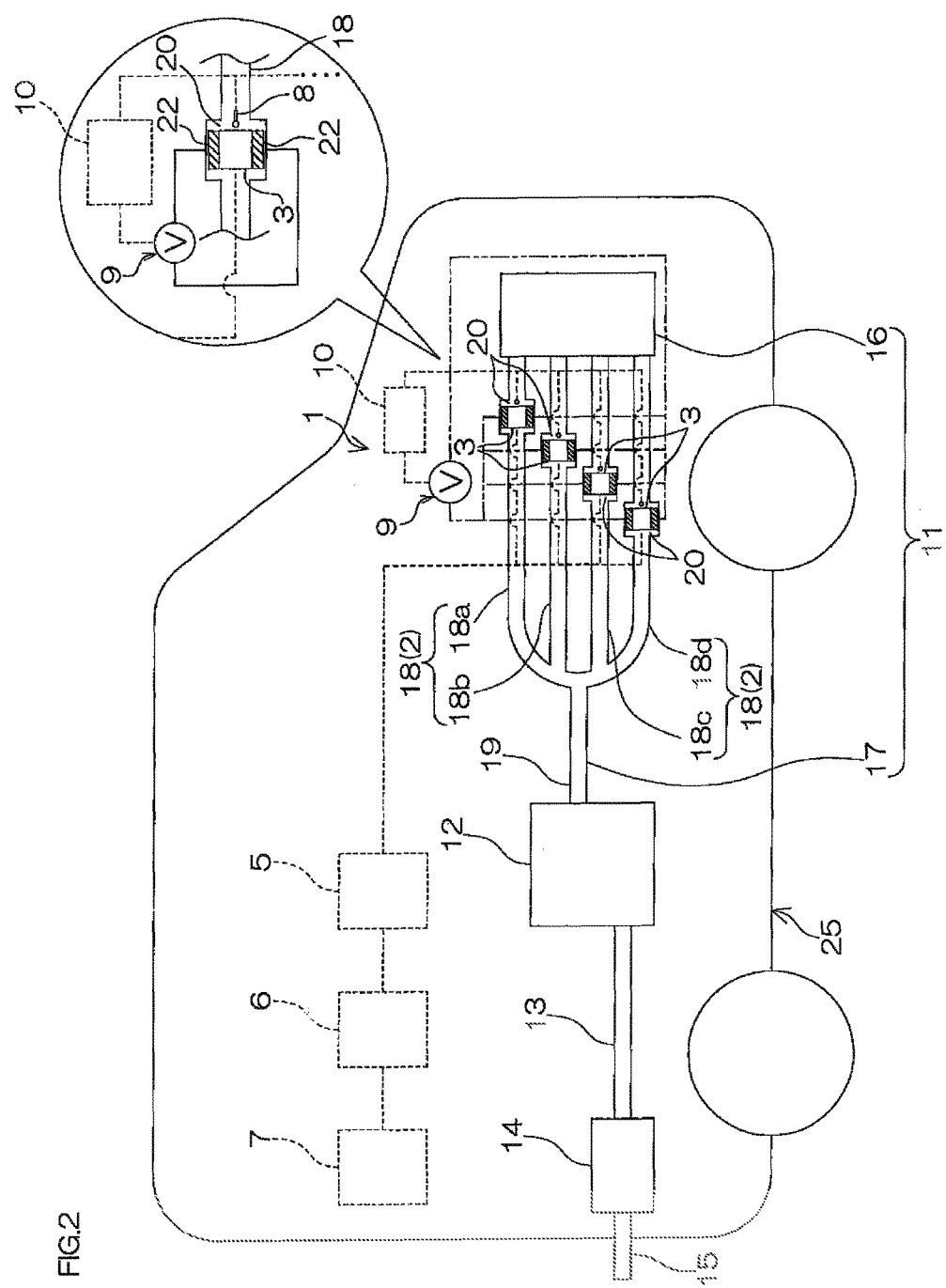
FIG. 2 is a schematic diagram illustrating the configuration of the first embodiment of the power-generating system of the present invention on board.
Figure 3:
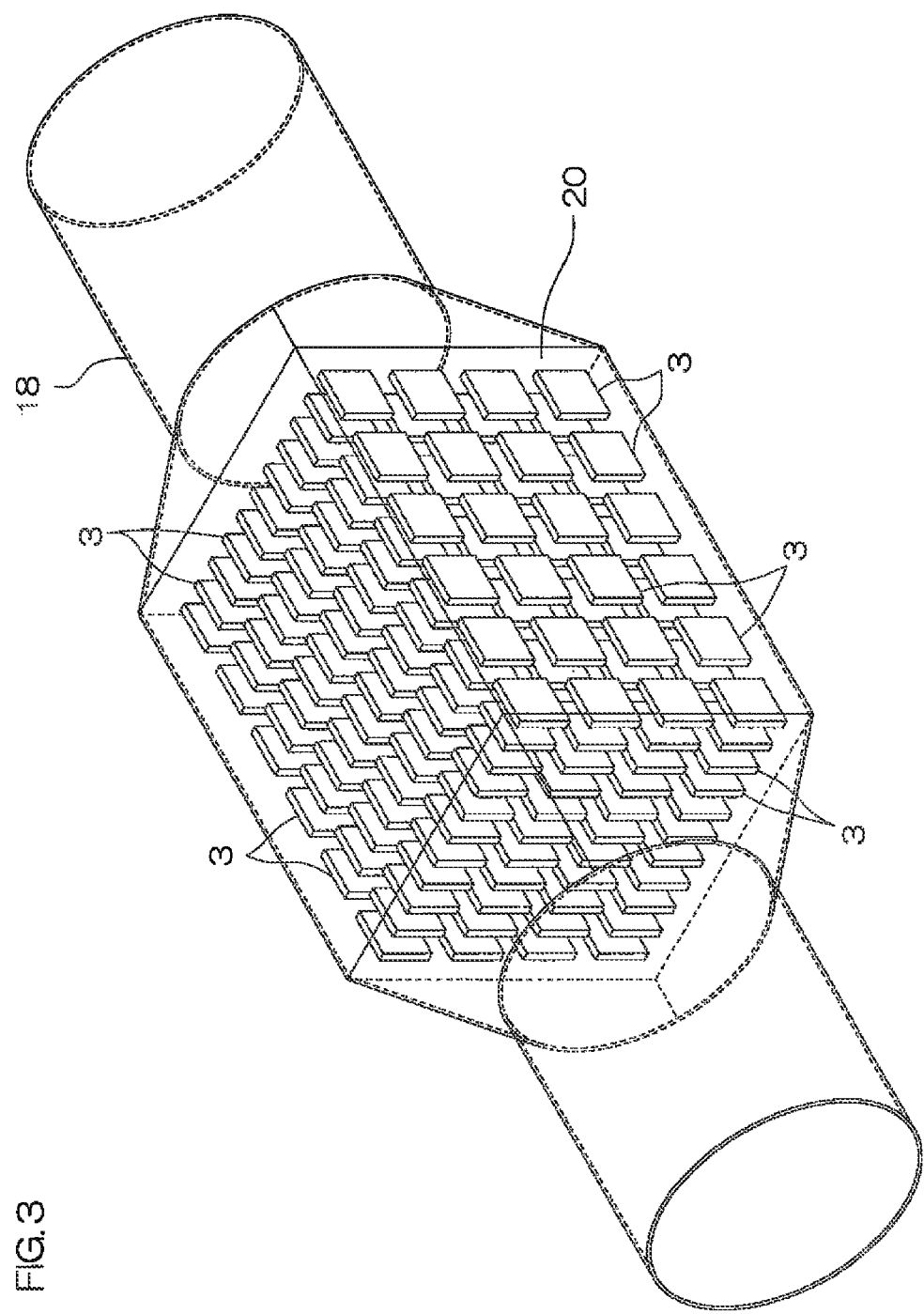
FIG. 3 is an enlarged view of a relevant part of the power-generating system shown in FIG. 2.

FIG. 2 is a schematic diagram illustrating the configuration of the first embodiment of the power-generating system of the present invention on board and FIG. 3 is an enlarged view of a relevant part of the power-generating system shown in FIG. 2.

In FIG. 2, an automobile 25 includes the internal combustion engine 11, a catalyst mount portion 12, an exhaust pipe 13, a muffler 14, and an outlet pipe 15.

The internal combustion engine 11 includes an engine 16 and an exhaust manifold 17.

The engine 16 is a multicylinder (four cylinder), multi-stroke cycle (four-stroke cycle) engine and upstream end portions of branch pipes 18 (described later) of the exhaust manifold 17 are connected to the cylinders.

The exhaust manifold 17 is provided for collecting the exhaust gas discharged from the cylinders of the engine 16 and includes a plurality of (four) branch pipes 18 (when these have to be distinguished, these are referred to as, from the top in FIG. 2, a branch pipe 18*a*, a branch pipe 18*b*, a branch pipe 18*c*, and a branch pipe 18*d*.) connected to the cylinders of the engine 16 and a collection pipe 19 that integrates the branch pipes 18 at a downstream side of the branch pipes 18.

Each of the branch pipes 18 includes one box space 20 on its way in the flow direction. The box space 20 is a substantially rectangular parallelepiped space intervened in and communicating with the branch pipe 18 and inside therein, includes a plurality of first devices 3 and second devices 4 (not shown) (ref: FIG. 3).

In FIG. 2, the plurality of first devices 3 are simplified; one first device 3 per one box space 20 is shown; and the description of the second device 4 is omitted.

In such an exhaust manifold 17, the upstream end portions of the branch pipes 18 are connected to the cylinders of the engine 16 and the downstream end portions of the branch pipes 18 are connected to the upstream end portion of the collection pipe 19. The downstream end portion of the collection pipe 19 is connected to the upstream end portion of the catalyst mount portion 12.

The catalyst mount portion 12 includes, for example, a catalyst carrier and a catalyst coated thereon and is connected to the downstream end portion of the internal combustion engine 11 (exhaust manifold 17) to purify toxic components such as hydrocarbon (HC), nitrogen oxide (NOx), and carbon monoxide (CO) contained in the exhaust gas discharged from the internal combustion engine 11.

The exhaust pipe 13 is provided for guiding the exhaust gas purified at the catalyst mount portion 12 to the muffler 14, the upstream end portion thereof is connected to the catalyst mount portion 12, and the downstream end portion thereof is connected to the muffler 14.

The muffler 14 is provided to reduce the noise generated in the engine 16 (in particular, power stroke) and the upstream end portion thereof is connected to the downstream end portion of the exhaust pipe 13. The downstream end portion of the muffler 14 is connected to the upstream end portion of the outlet pipe 15.

The outlet pipe 15 is provided for releasing, into the air, the exhaust gas that was discharged from the engine 16, and was purified, with its noise reduced passing through the exhaust manifold 17, the catalyst mount portion 12, the exhaust pipe 13, and the muffler 14 sequentially. The upstream end portion of the outlet pipe 15 is connected to the downstream end portion of the muffler 14 and the downstream end portion of the outlet pipe 15 is open into the air.

The automobile 25 is equipped with the above-described power-generating system 1.

The power-generating system 1 includes, as described above, a heat source 2, a first device 3, a second device 4, a temperature sensor 8, a voltage application device 9, and a control unit 10.

In the power-generating system 1, the engine 16 of the internal combustion engine 11 is used as the heat source 2 and, as shown in the enlarged view and FIG. 3, in the box space 20 of each of the branch pipes 18, the first devices 3 are disposed.

The first device 3 is formed into a sheet and, in the box space 20, the plurality of first devices 3 are arranged in line with a space provided from each other and are fixed by the second device 4 (or by a fixing member provided as necessary (not shown)), which is not shown.

In this manner, the both sides of the first device 3, i.e., the front face and the reverse face, and furthermore, the peripheral side faces are exposed to the air inside the box space 20 via the second device 4, which is not shown, so that they can be in contact with (exposed to) the exhaust gas.

The second device 4 includes, although not shown, two electrodes that are disposed to face each other with the first device 3 interposed therebetween and lead wires to be connected to these electrodes.

The temperature sensor 8 is disposed, as shown, in the enlarged view in FIG. 2, in the proximity of and the upstream of (flow direction of the exhaust gas) the plurality of first devices 3 in each of the branch pipes 18 and is disposed so as to be capable of detecting their temperature.

The number of the temperature sensor 8 is not limited, as long as the temperature of the plurality of first devices 3 (ref: FIG. 3) can be detected, and a single temperature sensor 8 or a plurality of temperature sensors 8 are provided as necessary.

The voltage application device 9 includes a plurality of (two per one first device 3) electrodes 22 and the electrodes 22 are disposed at the outer side of each of the first devices 3 so as to face each other and to interpose the first device 3 therebetween. The electrodes 22 are connected in parallel by, for example, a branch lead wire. Then, by applying a voltage to the electrodes 22 from the voltage application power source V, a voltage can be applied between the electrodes 22, that is, to the first device 3.

FIG. 2 schematically shows, in the box spaces 20, one first device 3 and a pair of electrodes 22 that are disposed to face each other with the first device 3 interposed therebetween.

The control unit 10 is electrically connected to all of the temperature sensors 8 and the voltage application devices 9 at outside the box space 20, as shown in the broken line.

To be specific, the control unit 10 is connected in parallel by, for example, a branch lead wire, to each of the temperature sensors 8 provided in the box spaces 20 and is connected to the voltage application device 9.

As shown in FIG. 2, the power-generating system 1 is electrically connected, in sequence, to the booster 5, the alternating current/direct current converter 6, and the battery 7.

In such an automobile 25, the engine 16 is driven by repetitive up-down motion of pistons in cylinders, performing the intake stroke, the compression stroke, the power stroke, and the exhaust stroke in sequence, thereby increasing and decreasing the temperature thereof over time.

To be more specific, for example, in the two cylinders of the cylinder connected to the branch pipe 18a and the cylinder connected to the branch pipe 18c, the pistons work together to conduct the intake stroke, the compression stroke, the power stroke, and the exhaust stroke synchronously. This allows fuel combustion and output of motive power, allowing a high temperature exhaust gas to pass through inside of the branch pipe 18a and the branch pipe 18c in the exhaust stroke.

At this time, the heat of the engine 16 is conducted through the exhaust gas (heating medium); and the internal temperature of the branch pipe 18a and the branch pipe 18c increases in the exhaust stroke and decreases in other strokes (intake stroke, compression stroke, and power stroke) and therefore, increases and decreases over time in accordance with the piston cycle, thus repeating a high-temperature state and a low-temperature state periodically.

On the other hand, at different timing from these two cylinders, in the two cylinders of the cylinder connected to the branch pipe 18b and the cylinder connected to the branch pipe 18d, pistons work together to conduct the intake stroke, the compression stroke, the power stroke, and the exhaust stroke synchronously. This allows fuel combustion and output of motive power at different timing from the branch pipe 18a and the branch pipe 18c, allowing a high temperature exhaust gas to pass through inside of the branch pipe 18b and the branch pipe 18d in the exhaust stroke.

At this time, the heat of the engine 16 is conducted through the exhaust gas (heating medium); and the internal temperature of the branch pipe 18b and the branch pipe 18d increases in the exhaust stroke and decreases in other strokes (intake stroke, compression stroke, and power stroke) and therefore, increases and decreases over time in accordance with the piston cycle, thus repeating a high-temperature state and a low-temperature state periodically.

The periodic temperature change occurs at the same period, but at a different phase from the periodic temperature change of the branch pipe 18a and the branch pipe 18c.

In the power-generating system 1, as described above, a sheet first device 3 is disposed inside each of the branch pipes 18 (in the box spaces 20).

Thus, when the exhaust gas discharged from the engine 16 (heat source 2) is introduced into the branch pipes 18 and the box space 20 is filled with the exhaust gas, in the box space 20, the both sides of the front face and the reverse face (furthermore, peripheral side faces) of the first device 3 make contact with (is exposed to) the exhaust gas (heating medium) (via the second device 4) and are heated and/or cooled.

That is, both sides of the front face and the reverse face of the first device 3 are heated and/or cooled by the temperature change over time of the engine 16 (heat source 2) and the heating medium that conducts heat of the engine 16.

In this manner, a periodic high-temperature state or low-temperature state can be caused in the first device 3 and polarization can be caused in the first device 3 in accordance with the effects (e.g., piezoelectric effect, pyroelectric effect, etc.) of the element (e.g., piezoelectric element, pyroelectric element, etc.).

Thus, in the power-generating system 1, a net generating power can be taken out from the first devices 3 via the second devices 4 as a periodically changing waveform (e.g., alternating current, pulsating current, etc.).

In the power-generating system 1, as described above, the temperature of the first device 3 is continuously detected by the temperature sensor 8.

When an increase in temperature of the first device 3 is detected, the voltage application device 9 is activated and a voltage is applied to the first device 3. On the other hand, when a decrease in temperature of the first device 3 is detected, the voltage application device 9 is stopped and the application of a voltage is stopped.

In this manner, in the above-described power-generating system 1, power generation efficiency can be improved and furthermore, damages to the first device 3 can be suppressed even if the temperature of the first device 3 is higher than the Curie temperature.

Furthermore, in the power-generating system 1, the temperature of the branch pipe 18a and the branch pipe 18c and the temperature of the branch pipe 18b and the branch pipe 18d change at the same period, but at a different phase periodically, and therefore, a net generating power can be taken out continuously as a periodically changing waveform (e.g., alternating current, pulsating current, etc.).

Then, the exhaust gas passes through the branch pipes 18 and then, is supplied to the collection pipe 19. After the collection, the exhaust gas is supplied to the catalyst mount portion 12 and is purified by the catalyst provided in the catalyst mount portion 12. Thereafter, the exhaust gas is supplied to the exhaust pipe 13 and after the noise is reduced in the muffler 14, the exhaust gas is discharged outside through the outlet pipe 15.

At this time, the exhaust gas that passes through the branch pipes 18 is collected in the collection pipe 19 and therefore, the temperature of the exhaust gas that passes through the collection pipe 19, the catalyst mount portion 12, the exhaust pipe 13, the muffler 14, and the outlet pipe 15 in sequence is smoothed.

Thus, the temperature of the collection pipe 19, the catalyst mount portion 12, the exhaust pipe 13, the muffler 14, and the outlet pipe 15, which allow the exhaust gas with its temperature smoothed to pass through, usually does not go up and down over time, keeping a substantially constant temperature.

Therefore, when the collection pipe 19, the catalyst mount portion 12, the exhaust pipe 13, the muffler 14, or the outlet pipe 15 is used as the heat source 2 and the above-described first devices 3 are disposed at the surrounding or inside thereof, the voltage of the net generating power taken out from the first device 3 is small and also is constant (direct current voltage).

Thus, in such a method, the voltage of the obtained net generating power cannot be increased efficiently with a simple structure, which is disadvantageous in that storage of electricity is inefficient.

On the other hand, as described above, when the first device 3 is disposed at the inner space of the branch pipes 18, a periodic high-temperature state or low-temperature state is allowed in the first device 3 based on the temperature change over time of the heat source 2 and periodic polarization can be caused in the first device 3 in accordance with the effects (e.g., piezoelectric effect, pyroelectric effect, etc.) of the device (e.g., piezoelectric element, pyroelectric element, etc.).

Thus, in the power-generating system 1, a net generating power can be taken out from the first devices 3 via the second devices 4 as a periodically changing waveform (e.g., alternating current, pulsating current, etc.).

Thereafter, in this method, for example, as shown by the dotted line in FIG. 2, the voltage of the net generating power obtained as described above is increased in the booster 5 connected to the second device 4 under the state of a periodically changing waveform (e.g., alternating current, pulsating current, etc.) and then, after the net generating power with its voltage boosted is converted to a direct current voltage in the alternating current/direct current converter 6, the net generating power is stored in the battery 7. Electrical power stored in the battery 7 is used suitably as a motive power for the automobile 25 or for various electrical accessories mounted in the automobile 25.

In such a power-generating system 1, the heat source 2 having a temporal temperature variation is used; therefore, a changing voltage (e.g., alternating current voltage) can be taken out; and, as a result, compared with the case where a constant voltage (direct current voltage) is taken out and converted with a DC-DC converter, excellently efficient boosting of voltage and storage of electricity can be achieved.

2. Second Embodiment

Figure 4:
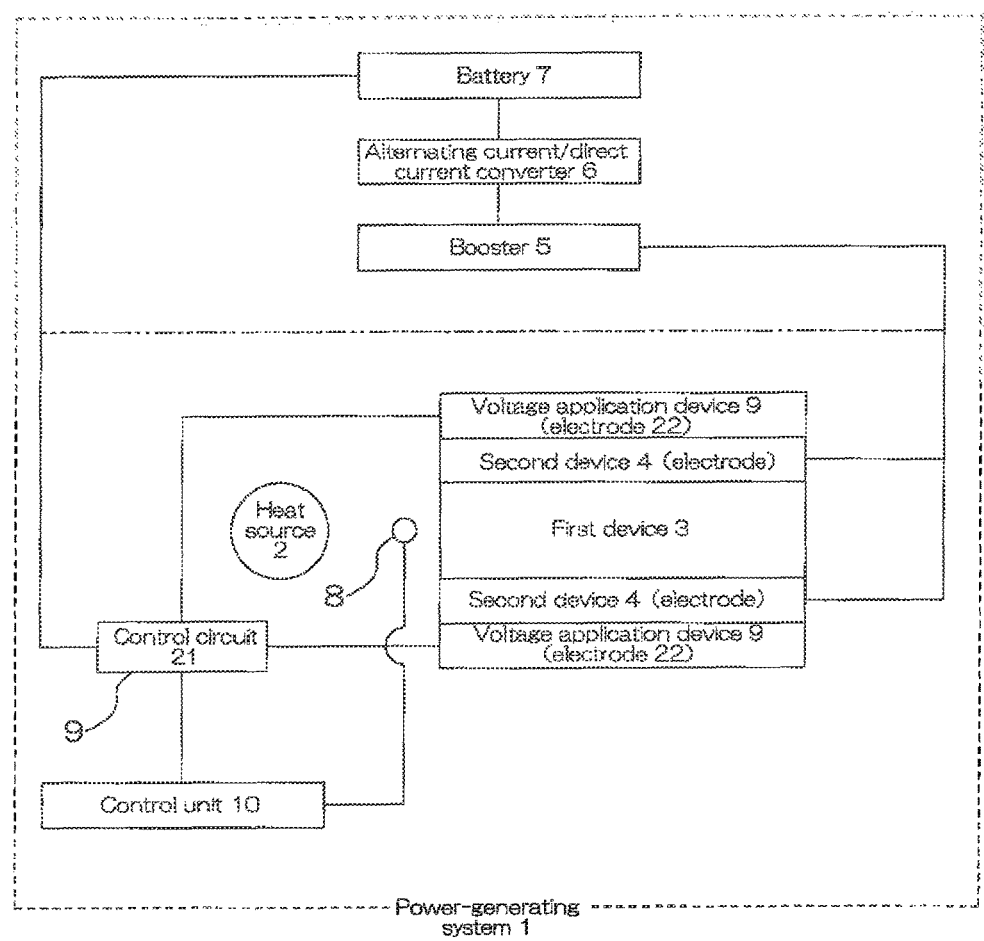
FIG. 4 is a schematic diagram illustrating the configuration of a second embodiment of the power-generating system of the present invention.

FIG. 4 is a schematic diagram illustrating the configuration of a second embodiment of the power-generating system of the present invention.

In FIG. 4, a power-generating system 1 includes a heat source 2 which is able to produce temporal temperature variation; a first device 3 which is able to produce temporal temperature variation based on the temperature change of the heat source 2 and in which polarization occurs; a second device 4 that takes out a net generating power from the first device 3; a battery 7 that stores the net generating power taken out from the first device 3; a temperature sensor 8 as a detection unit that detects the temperature of the first device 3; a voltage application device 9 as a voltage application unit that applies a voltage to the first device 3 using the net generating power taken out from the first device 3; and a control unit 10 as a control unit for activating the voltage application device 9 on detecting an increase in temperature of the first device 3 and for stopping the voltage application device 9 on detecting a decrease in temperature of the first device 3 by the temperature sensor 8.

Examples of the heat source 2, the first device 3, and the second device 4 include the same as those in the above-described first embodiment.

The battery 7 is a known battery that is capable of storing a net generating power taken out from the first device 3 and through a booster 5 and an alternating current/direct current converter (AC-DC converter) 6, is electrically connected to the second device 4.

The temperature sensor 8 is provided in the proximity of or in contact with the first device 3 to detect the temperature of the first device 3. The temperature sensor 8 directly detects the surface temperature of the first device 3 or detects the ambient temperature of the surrounding of the first device 3, as the temperature of the first device 3, and, for example, a known temperature sensor such as an infrared thermometer and a thermocouple thermometer is used.

The voltage application device 9 is provided directly or in the proximity of the first device 3 to apply a voltage to the first device 3. To be specific, the voltage application device 9 includes, for example, separately from the above-described second device 4, two electrodes (for example, copper electrode, silver electrode, etc.) 22 that are disposed to face each other with the first device 3 interposed therebetween, a control circuit 21, and lead wires connected to these and is disposed so that the first device 3 and the second device 4 are interposed between their electrodes 22.

The voltage application device 9 is electrically connected to the battery 7 and makes electrical power stored in the battery 7 available.

The voltage application device 9 includes the control circuit 21. The control circuit 21 is a switch circuit for switching the supply or stop of electrical power to the electrodes 22 of the voltage application device 9 and is disposed so as to be interposed between the battery 7 and the electrodes 22.

The control unit 10 is a unit (for example, ECU: Electronic Control Unit) that carries out electrical control in the power-generating system 1 and is configured from a micro computer including a CPU, a ROM, and a RAM.

The control unit 10 is electrically connected to the temperature sensor 8 and the voltage application device 9 (that is, the control circuit 21) and, although to be described later, activates or stops the voltage application device 9 when an increase or decrease in temperature of the first device 3 is detected by the above-described temperature sensor 8.

In such a power-generating system 1, generation of electricity is achieved in the same manner as that in the above-described first embodiment.

In the power-generating system 1, when the first device 3 is detected as an increased-temperature state, by the control unit 10, the control circuit 21 is switched; using electrical power stored in the battery 7, that is, the net generating power taken out from the first device 3, the voltage application device 9 is activated; and a predetermined voltage is applied to the first device 3.

An example of the applied voltage includes the same as that in the above-described first embodiment.

The time for applying a voltage is until the first device 3 reaches a decreased-temperature state, to be specific, during an increased-temperature state.

When the first device 3 is detected as a decreased-temperature state, by the control unit 10, the control circuit 21 is switched; the voltage application device 9 is stopped; and the application of a voltage to the first device 3 is stopped.

The time for stopping the application of a voltage is until the first device 3 reaches an increased-temperature state, to be specific, during a decreased-temperature state.

The required time from activation of the voltage application device 9 until application of the above-described voltage (that is, arrival of the intensity of the electric field at the above-described predetermined value) and the required time from stop of the voltage application device 9 until arrival of the intensity of the electric field at 0 kV/mm can be regarded as substantially 0 second.

That is, in the power-generating system 1, the time for a voltage below the above-described predetermined value to be applied is substantially 0 second and a state in which a voltage at the above-described predetermined value is applied (ON) and a state in which a voltage is not applied (OFF) are switched by the control unit 10.

In this manner, in the above-described power-generating system 1, when an increase in temperature of the first device 3 is detected, the voltage application device 9 is activated and a voltage is applied to the first device 3. On the other hand, when a decrease in temperature of the first device 3 is detected, the voltage application device 9 is stopped and the application of a voltage is stopped.

In such a power-generating system 1, the first device 3 may be temporarily maintained in a constant temperature state (temperature change amount is below a predetermined value (e.g., 0.2° C./s)) without an increase or decrease in temperature in accordance with a heating and/or cooling method. In such a case, a voltage is applied during an increase in temperature of the first device 3 and during a constant temperature state after the increase thereof and the application of a voltage is stopped during a decrease in temperature and during a constant temperature state after the decrease thereof. As described later, in the case of using an internal combustion engine 11 of an automobile as the heat source 2, the first device 3 is not substantially brought into a constant temperature state and an increased-temperature state and a decreased-temperature state are repeated.

With such a power-generating system 1, a net generating power can be efficiently taken out from the first device 3 by applying a voltage to the first device 3. In the power-generating system 1, the net generating power taken out from the first device 3 can be used in the voltage application device 9, so that an external power source, etc. for activating the voltage application device 9 is not required and space saving can be achieved.

In the above-described power-generating system 1, the net generating power taken out from the first device 3 is stored in the battery 7, so that electrical power stored in the battery 7 can be used in an arbitrary electric device.

In the power-generating system 1, electrical power stored in the battery 7 is used in the voltage application device 9, so that a voltage can be applied to the first device 3 at an arbitrary timing and thus, power generation efficiency can be improved.

Furthermore, in the power-generating system 1, when an increase in temperature of the first device 3 is detected, the voltage application device 9 is activated and a voltage is applied to the first device 3. On the other hand, when a decrease in temperature of the first device 3 is detected, the voltage application device 9 is stopped and the application of a voltage is stopped.

Thus, with the power-generating system 1, compared with the case where a voltage is not applied, energy can be efficiently taken out from the first device 3 by a relatively easy method of activating or stopping the voltage application device 9, that is, operating ON/OFF, so that power generation efficiency can be improved.

Also, as a method for improvement of power generation efficiency, as described above, for example, it has been considered that not only the voltage application device 9 is simply activated or stopped, but also the degree of the applied voltage changes in accordance with the temperature state of the first device 3. However, in such a method, there is a disadvantage that a complicated operation of gradually increasing or decreasing the applied voltage is required, which takes labor.

Meanwhile, in the above-described power-generating system 1, by a relatively easy method of activating or stopping the voltage application device 9, power generation efficiency can be improved.

Furthermore, when the above-described first device 3 is exposed to an environment in which the temperature is higher than the Curie temperature, the first device 3 may be damaged, which may reduce power generation performance or power generation may not be achieved. However, in the above-described power-generating system 1, when the temperature of the first device 3 is increased, a voltage is applied, so that even if the first device 3 is exposed to an environment in which the temperature is higher than the Curie temperature, damages to the first device 3 can be suppressed and reduction in power generation performance and power generation failure of the power-generating system 1 can be suppressed. As a result, electricity can be generated with excellent efficiency even under a high-temperature environment.

The net generating power thus taken out from the power-generating system 1 is boosted in the booster 5 connected to the second device 4, as in a state of a periodically changing waveform (e.g., alternating current, pulsating current, etc.). For the booster 5, a booster that is capable of boosting the alternating current voltage with excellent efficiency with a simple structure using, for example, a coil, condenser, etc is used.

Then, the net generating power with its voltage boosted by the booster 5 is converted to a direct current voltage in the alternating current/direct current converter 6 and thereafter, stored in the battery 7.

With such a power-generating system. 1, the heat source 2 having a temporal temperature variation is used and therefore, a changing voltage (e.g., alternating current voltage) can be taken out and, as a result, compared with the case where a constant voltage (direct current voltage) is taken out, a net generating power can be stored with a simple structure and excellent boosting efficiency.

Furthermore, when the heat source 2 is a heat source that undergoes a periodic temperature change, the net generating power can be taken out as a periodically changing waveform and, as a result, the net generating power can be stored with a simple structure and excellent boosting efficiency.

Figure 5:
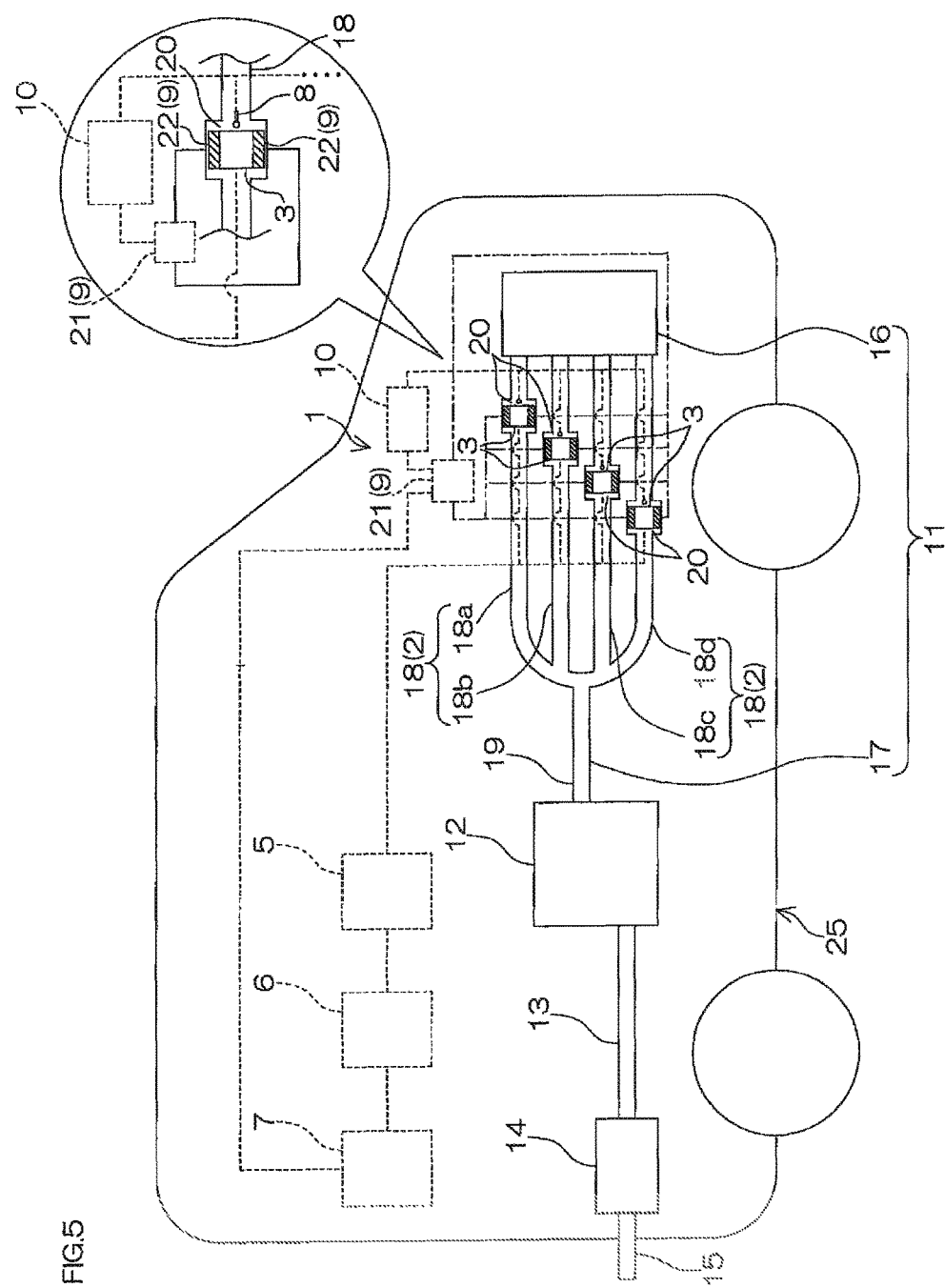
FIG. 5 is a schematic diagram illustrating the configuration of the second embodiment of the power-generating system of the present invention on board.
Figure 6:
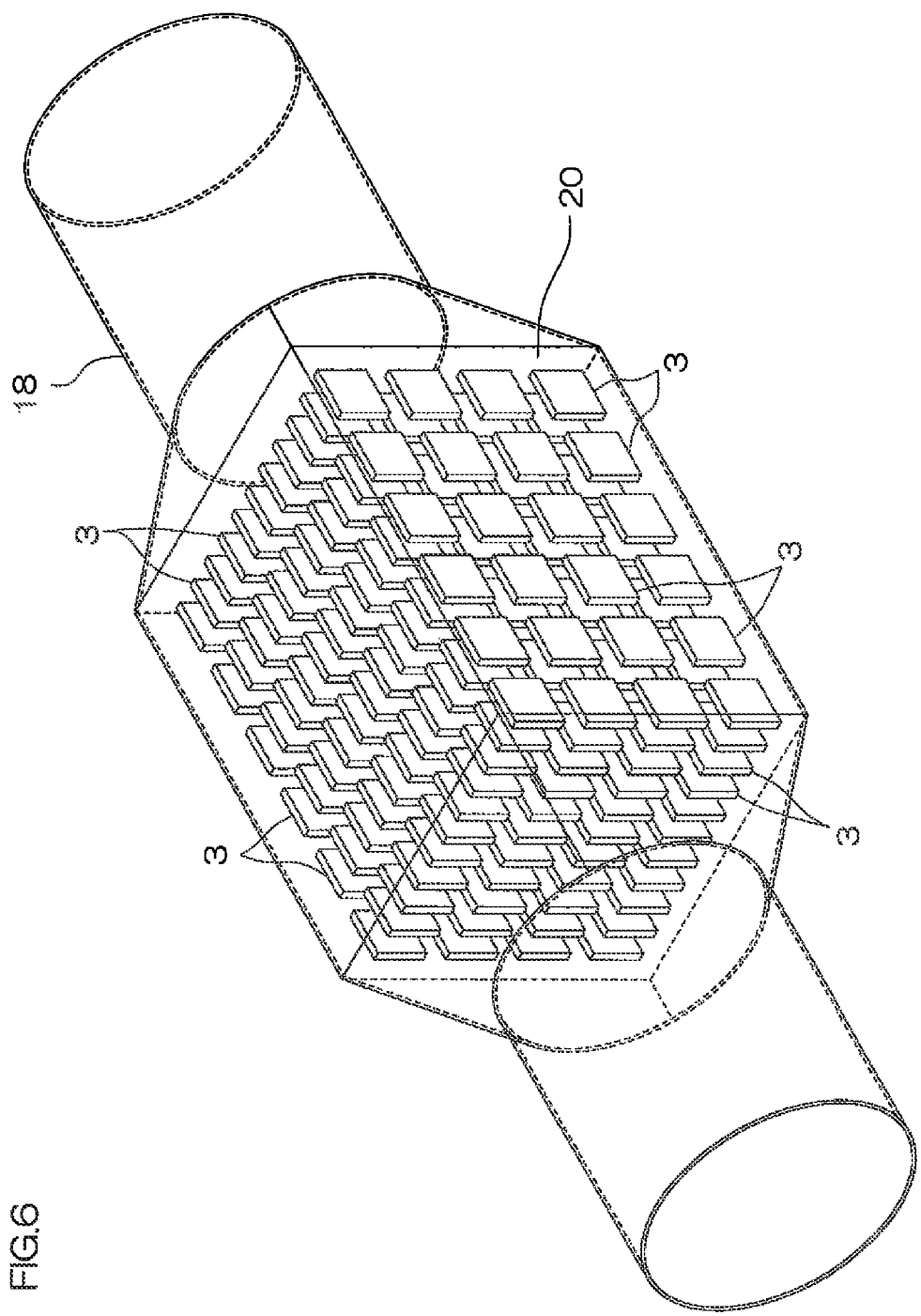
FIG. 6 is an enlarged view of a relevant part of the power-generating system shown in FIG. 5.

FIG. 5 is a schematic diagram illustrating the configuration of the second embodiment of the power-generating system of the present invention on board and FIG. 6 is an enlarged view of a relevant part of the power-generating system shown in FIG. 5.

In FIG. 5, an automobile 25 includes the internal combustion engine 11, a catalyst mount portion 12, an exhaust pipe 13, a muffler 14, and an outlet pipe 15 in the same manner as the automobile 25 in the above-described first embodiment.

The automobile 25 is equipped with the above-described power-generating system 1.

The power-generating system 1 includes, as described above, a heat source 2, a first device 3, a second device 4, a battery 7, a temperature sensor 8, a voltage application device 9, and a control unit 10.

In the power-generating system 1, an engine 16 of the internal combustion engine 11 is used as the heat source 2 and, as shown in the enlarged view and FIG. 6, in a box space 20 of each of branch pipes 18, the first devices 3 are disposed.

The first device 3 is formed into a sheet and, in the box space 20, the plurality of first devices 3 are arranged in line with a space provided from each other and are fixed by the second device 4 (or by a fixing member provided as necessary (not shown)), which is not shown.

In this manner, the both sides of the first device 3, i.e., the front face and the reverse face, and furthermore, the peripheral side faces are exposed to the air inside the box space 20 via the second device 4, which is not shown, so that they can be in contact with (exposed to) the exhaust gas.

The second device 4 includes, although not shown, two electrodes that are disposed to face each other with the first device 3 interposed therebetween and lead wires to be connected to these electrodes.

As shown by the broken line in FIG. 5, the second device 4 (not shown) is electrically connected, in sequence, to the booster 5, the alternating current/direct current converter 6, and the battery 7.

The temperature sensor 8 is disposed, as shown in the enlarged view in FIG. 5, in the proximity of and the upstream of (flow direction of the exhaust gas) the plurality of first devices 3 in each of the branch pipes 18 and is disposed so as to be capable of detecting their temperature.

The number of the temperature sensor 8 is not limited, as long as the temperature of the plurality of first devices 3 (ref: FIG. 6) can be detected, and a single temperature sensor 8 or a plurality of temperature sensors 8 are provided as necessary.

The voltage application device 9 includes a plurality of (two per one first device 3) electrodes 22 and the electrodes 22 are disposed at the outer side of each of the first devices 3 so as to face each other and to interpose the first device 3 therebetween. The electrodes 22 are connected in parallel by, for example, a branch lead wire and the branch wire, etc., are integrated into the control circuit 21. In the voltage application device 9, by switching of the control circuit 21, by applying a voltage to the electrodes 22 using electrical power stored in the battery 7, a voltage can be applied between the electrodes 22, that is, to the first device 3.

FIG. 5 schematically shows, in the box spaces 20, one first device 3 and a pair of electrodes 22 that are disposed to face each other with the first device 3 interposed therebetween.

The control unit 10 is electrically connected to all of the temperature sensors 8 and the voltage application devices 9 at outside the box space 20, as shown in the broken line.

To be specific, the control unit 10 is connected in parallel by, for example, a branch lead wire, to each of the temperature sensors 8 provided in the box spaces 20 and is connected to the voltage application device 9.

In such an automobile 25, the engine 16 is driven and generation of electricity is performed by the power-generating system 1 in the same manner as that in the above-described first embodiment.

The obtained voltage of the net generating power is increased in the booster 5 connected to the second device 4 under the state of a periodically changing waveform (e.g., alternating current, pulsating current, etc.) and then, after the net generating power with its voltage boosted is converted to a direct current voltage in the alternating current/direct current converter 6, the net generating power is stored in the battery 7 in the same manner as that in the above-described first embodiment.

Electrical power stored in the battery 7 is, as described above, used by the voltage application device 9 and, in addition, for example, can be used suitably as a motive power for the automobile 25 or for various electrical accessories mounted in the automobile 25.

In such a power-generating system 1, the heat source 2 having a temporal temperature variation is used; therefore, a changing voltage (e.g., alternating current voltage) can be taken out; and, as a result, compared with the case where a constant voltage (direct current voltage) is taken out and converted with a DC-DC converter, excellently efficient boosting of voltage and storage of electricity can be achieved.

In the power-generating system 1, without including an alternating current/direct current converter 6 and furthermore, using a DC-DC converter as necessary, the net generating power that is taken out can be also used as in an alternating current suitably as a motive power for various electrical accessories, etc.

Furthermore, in the power-generating system 1, for example, without including a battery 7, the net generating power that is taken out can be also used as it is in the voltage application device 9. In such a case, as shown by the phantom line in FIG. 4, the second device 4 is electrically connected to the control circuit 21 of the voltage application device 9.

EXAMPLES

While in the following, the present invention is described with reference to Examples, the present invention is not limited to any of them by no means.

Example 1

Example as First Embodiment

Reference Example as Second Embodiment

A bulk piezoelectric element (first device having a silver electrode (second device) on the front face and the reverse face thereof; composition: PZT; Curie temperature (Tc): 295° C., relative dielectric constant: 2130; product number: C-6; manufactured by Fuji ceramics corporation) was cut into a sheet having a size of 15 mm (length)×10 mm (width)×0.5 mm (thickness).

Then, a resistance element of 100 kΩ was disposed in parallel with the piezoelectric element. The resistance element was provided so as to clearly check electric current characteristics.

As the heat source, an engine (3 cylinder: 4 cycle) connected to a dynamometer (model number: KF engine, manufactured by Daihatsu Motor Co., Ltd.) was used. One pipe through which the exhaust gas passed was selected, a box space was formed on the way of the pipe at a position of 55 cm from the engine, and the above-described samples were disposed.

Then, a thermocouple (temperature sensor) was disposed so that the temperature of the samples can be detected and the samples were sandwiched between electrodes of a voltage application device (model number: MODEL677B, manufactured by Trek Japan) so as to apply a voltage. Next, the voltage application device and a control unit were disposed outside the box space and they were electrically connected to each other.

In the control unit (CPU), a case where the temperature of the sample measured by the thermocouple increased 0.2° C./s or higher was set to be an increased-temperature state and a case where the temperature thereof decreased 0.2° C./s or lower was set to be a decreased-temperature state.

Thereafter, the engine was operated with JC08 mode and the sample was exposed to the exhaust gas having a temporal temperature variation. In this manner, the temporal temperature variation of the piezoelectric element was obtained; polarization was caused; and the generated voltage (net generating power) was taken out via the electrode and the lead wire.

The temperature (average value) of the sample was measured with the thermocouple and a voltage (intensity of electric field: 0.25 kV/mm) was applied to the sample when the sample was detected as an increased-temperature state.

Then, the voltage change of the net generating power taken out from the sample was observed with a voltmeter.

Figure 7:
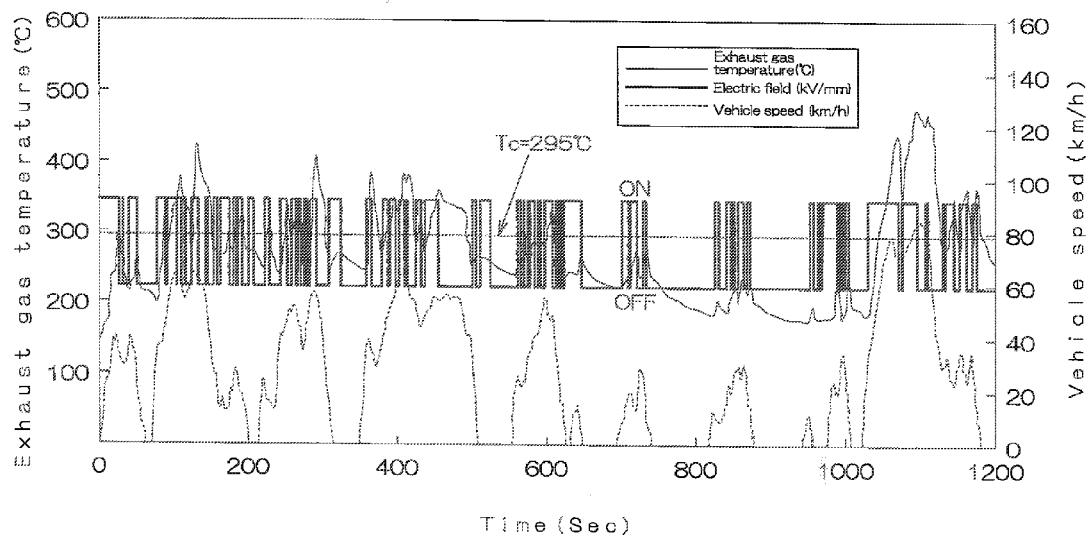
FIG. 7 is a graph illustrating the relationship between the applied voltage and the temperature change in Example 1.
Figure 8:
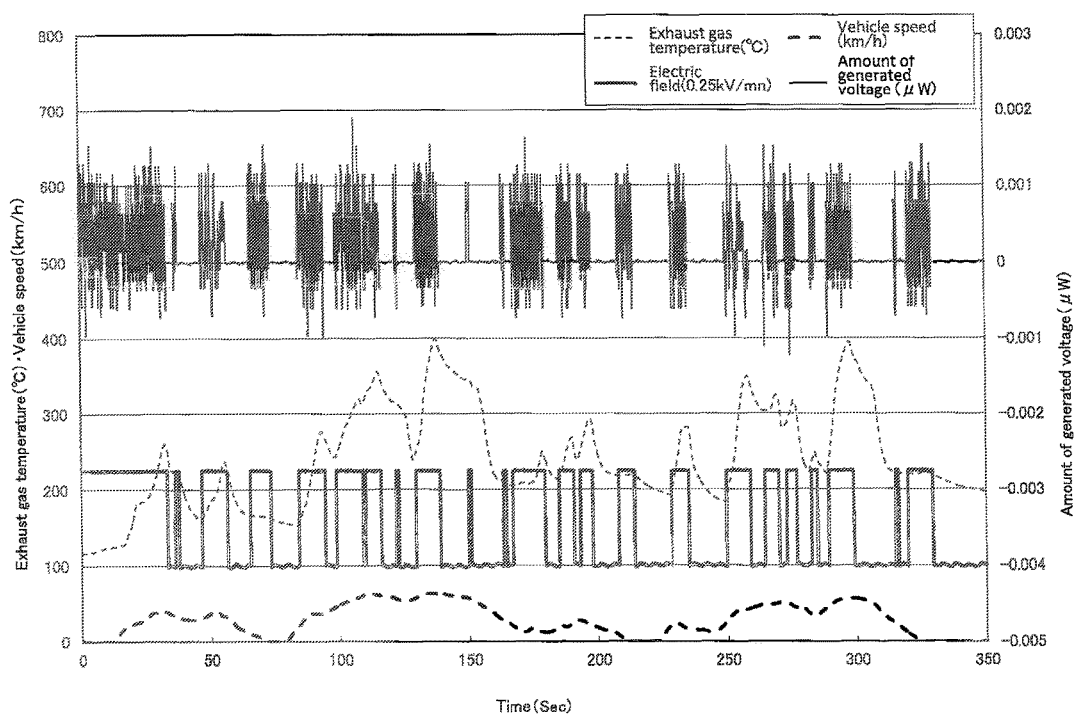
FIG. 8 is a graph illustrating the relationship of the applied voltage, the temperature change, and the generated voltage in Example 1.

In this manner, the engine operation with JC08 mode was repeated. The relationship between the applied voltage and the temperature change is shown in FIG. 7. The generated voltage until the lapse of 350 seconds after the start of the operation with JC08 mode is shown in FIG. 8, along with the relationship between the applied voltage and the temperature change.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

A power-generating system of the present invention is used to generate electricity by heat energy released in various energy-using devices including a device such as internal combustion engines including an automobiles engine, heat exchanger including a boiler and air-conditioning equipment, motor generators including a power generator and a motor, and luminous device including lightings.

DESCRIPTION OF THE REFERENCE NUMERALS

1: Power-generating system
2: Heat source
3: First device
4: Second device
5: Booster
6: Alternating current/direct current converter
7: Battery
8: Temperature sensor
9: Voltage application device
10: Control unit

The invention claimed is:

1. A power-generating system comprising:
  a heat source which is configured to produce temporal temperature variation;
  a first device which is configured to produce temporal temperature variation based on the temperature change of the heat source and in which polarization occurs;
  a second device which is configured to take out a net generating power from the first device;

a detection unit that detects the temperature of the first device;

a voltage application unit that applies a voltage to the first device; and a control unit configured to activate the voltage application unit on detecting an increase in temperature of the first device and configured to stop the voltage application unit on detecting a decrease in temperature of the first device by the detection unit, wherein the first device is a pyroelectric element.

2. The power-generating system according to claim 1, wherein the detection unit comprises a least one of an infrared thermometer or a thermocouple thermometer.

3. The power-generating system according to claim 1, further comprising:

a battery which is electrically connected to the second device and is capable of storing the net generating power taken out from the first device.

* * * * *